United States Patent
Scurati et al.

(10) Patent No.: US 9,892,994 B2
(45) Date of Patent: Feb. 13, 2018

(54) GRAPHENE BASED FILLER MATERIAL OF SUPERIOR THERMAL CONDUCTIVITY FOR CHIP ATTACHMENT IN MICROSTRUCTURE DEVICES

(71) Applicant: STMicroelectronics S.r.l., Agrate Brianza (IT)

(72) Inventors: Mario Giovanni Scurati, Milan (IT); Laura Ceriati, Carnate (IT); Luciano Benini, Cava Manara (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 168 days.

(21) Appl. No.: 14/946,502

(22) Filed: Nov. 19, 2015

(65) Prior Publication Data

US 2016/0079144 A1 Mar. 17, 2016

Related U.S. Application Data

(62) Division of application No. 14/215,597, filed on Mar. 17, 2014, now abandoned.

(30) Foreign Application Priority Data

Mar. 20, 2013 (IT) ................ VI2013A0077

(51) Int. Cl.
*H01L 23/373* (2006.01)
*B29C 65/48* (2006.01)
(Continued)

(52) U.S. Cl.
CPC ...... *H01L 23/3733* (2013.01); *B29C 65/4855* (2013.01); *B29C 65/4865* (2013.01);
(Continued)

(58) Field of Classification Search
None
See application file for complete search history.

(56) References Cited

U.S. PATENT DOCUMENTS 7,432,586 B2  10/2008  Zhao et al.
7,872,277 B2 *  1/2011  Hsu ............... H01L 33/641
                                                      257/690
(Continued)

FOREIGN PATENT DOCUMENTS

CN    102881667 A    1/2013
CN    204367303 U    6/2015
(Continued)

OTHER PUBLICATIONS

Definition of "Adjacent," Merriam-Webster, http://www.merriam-webster.com/dictionary/adjacent, accessed Dec. 2, 2015 (4 pages).
(Continued)

*Primary Examiner* — Michelle Mandala
(74) *Attorney, Agent, or Firm* — Gardere Wynne Sewell LLP

(57) ABSTRACT

An integrated circuit chip attachment in a microstructure device is accomplished through the use of an adhesive-based material in which graphene flakes are incorporated. This results in superior thermal conductivity. The spatial orientation of the graphene flakes is controlled, for example by adhering polar molecules to the graphene flakes and exposing the flakes to an external force field, so that the graphene flakes have desired orientations under the integrated circuit chip, alongside of the integrated circuit chip and above the integrated circuit chip.

25 Claims, 7 Drawing Sheets

(51) Int. Cl.
*B29C 65/54* (2006.01)
*H01L 21/56* (2006.01)
*H01L 21/78* (2006.01)
*H01L 23/42* (2006.01)
*H01L 23/00* (2006.01)

(52) U.S. Cl.
CPC ............ *B29C 65/54* (2013.01); *H01L 21/561* (2013.01); *H01L 21/565* (2013.01); *H01L 21/78* (2013.01); *H01L 23/373* (2013.01); *H01L 23/42* (2013.01); *H01L 24/83* (2013.01); *H01L 24/97* (2013.01); *H01L 2224/2929* (2013.01); *H01L 2224/29099* (2013.01); *H01L 2224/29193* (2013.01); *H01L 2224/29393* (2013.01); *H01L 2224/29499* (2013.01); *H01L 2224/32221* (2013.01); *H01L 2224/32245* (2013.01); *H01L 2224/83855* (2013.01); *H01L 2924/13055* (2013.01); *H01L 2924/13091* (2013.01); *Y10T 428/30* (2015.01)

(56) References Cited

U.S. PATENT DOCUMENTS

| | | |
|---|---|---|
| 8,263,843 B2 | 9/2012 | Kim et al. |
| 8,704,341 B2 | 4/2014 | Lin et al. |
| 9,646,906 B2 | 5/2017 | Cook et al. |
| 2002/0167800 A1 | 11/2002 | Smalc |
| 2004/0016913 A1* | 1/2004 | Sognefest .............. H01B 1/22 252/500 |
| 2005/0061496 A1 | 3/2005 | Matabayas |
| 2005/0280139 A1 | 12/2005 | Zhao et al. |
| 2007/0053166 A1 | 3/2007 | Hwang et al. |
| 2007/0267734 A1 | 11/2007 | Zhao et al. |
| 2007/0278632 A1 | 12/2007 | Zhao et al. |
| 2009/0212418 A1 | 8/2009 | Gurrum et al. |
| 2010/0085713 A1 | 4/2010 | Balandin et al. |
| 2012/0285673 A1 | 11/2012 | Cola et al. |
| 2013/0020716 A1 | 1/2013 | Kuczynski et al. |
| 2013/0221511 A1 | 8/2013 | Higgins, III et al. |
| 2013/0299140 A1 | 11/2013 | Ling et al. |
| 2013/0307128 A1 | 11/2013 | Lin et al. |
| 2014/0070393 A1 | 3/2014 | Bartley et al. |
| 2014/0160682 A1 | 6/2014 | Ben Jamaa et al. |
| 2014/0287239 A1 | 9/2014 | Scurati et al. |
| 2014/0353816 A1 | 12/2014 | Yap et al. |
| 2017/0058176 A1 | 3/2017 | Chou et al. |

FOREIGN PATENT DOCUMENTS

| | | |
|---|---|---|
| EP | 2213756 A1 | 8/2010 |
| WO | WO-02081190 A1 | 10/2002 |
| WO | WO-2007063309 A1 | 6/2007 |
| WO | WO-2016049650 A1 | 3/2016 |

OTHER PUBLICATIONS

Goyal Vivek et al: "Thermal Properties of the Hybrid Graphene-Metal Nano-Micro-Composites: Applications in Thermal Interface Materials," Applied Physics Letters, American Institut3e of Physics, US, vol. 100, No. 7, Feb. 13, 2012 (4 pages).

Huang et al: "Toward Effective Synergetic Effects from Graphene Nanoplatelets and Carbon Nanotubes on Thermal Conductivity of Ultrahigh Volume Fraction Nanocarbon Epoxy Composites," Oct. 2012, J. Phys. Chem. C, vol. 116, pp. 23812-23820.

Italian Search Report and Written Opinion for IT VI2013A000077 dated Jan. 7, 2014 (10 pages).

Shahil et al: "Graphene-Multilayer Graphene Nanocomposites as Highly Efficient Thermal Interface Materials," Jan. 2012, Nano Letters, vol. 12, pp. 861-867.

Shen et al: "Ultrathin Flexible Graphene Film: An Excellent Thermal Conducting Material with Efficient EMI Shielding," Advanced Functional Materials 24: 4542-4548, 2014.

\* cited by examiner

US 9,892,994 B2

GRAPHENE BASED FILLER MATERIAL OF SUPERIOR THERMAL CONDUCTIVITY FOR CHIP ATTACHMENT IN MICROSTRUCTURE DEVICES

CROSS-REFERENCE TO RELATED APPLICATIONS

This application is a divisional application from United States application for patent Ser. No. 14/215,597 filed Mar. 17, 2014, which claims priority from Italian Application for Patent No. VI2013A000077 filed Mar. 20, 2013, the disclosures of which are incorporated by reference.

TECHNICAL FIELD

The present disclosure generally relates to the field of microstructures, such as integrated circuits, and more particularly relates to heat dissipation and thermal management of semiconductor devices.

BACKGROUND

In modern integrated circuits, waste heat is produced due to the presence of a very high number of individual circuit elements, such as field effect transistors in the form of CMOS, NMOS, PMOS elements, resistors, capacitors, and the like, or due to the presence of high power components operating at elevated current levels. Typically, feature sizes of these circuit elements are continuously decreased with the introduction of every new circuit generation to provide currently available integrated circuits formed by volume production techniques with critical dimensions of 50 nm or less in the small signal regime and having an improved degree of performance in terms of speed and/or power consumption. On the other hand, power transistors, IGBT, and the like are used in high-power applications or in circuit portions of combined small signal/high-power devices, which operate at operating currents of several 100 A and higher. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements a plurality of passive circuit elements, such as capacitors, resistors, interconnect structures and the like are typically formed in integrated circuits as required by the basic circuit layout. Due to the decreased dimensions of the active circuit elements, not only performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits, power circuits and the like, thereby providing entire systems on a single chip (SoC).

The increased packing density of integrated circuits resulting from the reduced device dimensions may also be accompanied by reduced switching speeds of the individual transistors in complex logic circuitry, thereby frequently contributing to increased power consumption in MOS circuits, since the reduced switching speeds allow the operation of the transistors at higher switching frequencies, which in turn increases the dynamic power consumption of the entire device. Furthermore, usually increased switching speed of advanced transistors is associated with very thin gate dielectrics, which contributes to increased static power consumption. Therefore, in sophisticated applications using densely packed integrated circuits the heat generation may reach extremely high values due to the dynamic losses caused by the high operating frequency in combination with a significant static power consumption of highly scaled transistor devices owing to increased leakage currents that may stem from extremely thin gate dielectrics, short channel effects, and the like. Similarly, in power applications the reduction of size of the power devices also results in increased switching times and high current density. Therefore, great efforts are being made in order to reduce overall power consumption by restricting the usage of high performance transistors, which usually cause higher heat generation, to performance critical signal paths in the circuit design, while using less critical devices in a other circuit areas. Moreover, appropriate mechanisms may be implemented to operate certain circuit portions "on demand" and control local or global operating conditions depending on the thermal situation in the semiconductor die.

The heat generated during the operation of the internal circuit elements is typically dissipated via the substrate material or the complex metallization system including highly conductive metals and sophisticated dielectric materials, depending on the overall configuration of the semiconductor device, the package accommodating the semiconductor device and the contact regime for connecting the metallization system to the wiring system of the package. Finally, the internally generated heat has to be transferred to the package and to an external cooling system connected to the package. Thus, a wide variety of cooling systems have been developed with complex passive architectures, such as specifically designed heat sinks and heat pipes, and also expensive active cooling devices, for instance in the form of fans, water cooling systems, Peltier elements, and the like. With the quest for high performance of complex semiconductor devices, the corresponding power consumption of semiconductor devices, such as microprocessors, have reached the 100 Watt range, while the shrinking technology ground rules have resulted in increased thermal density of these semiconductor devices, since continuously more transistors are packed into a smaller die region. Since external heat management systems, i.e. systems, which may be operated on the basis of the internal thermal state of the semiconductor device, may not enable a reliable estimation of the die internal temperature distribution due to the delayed thermal response of the package of the semiconductor device and the possibly insufficient spatial temperature resolution of device internal temperature monitoring systems, respective external cooling systems may have to be designed so as to take into consideration these restrictions and to provide for sufficient operational margins with respect to heat control unless a certain risk of overheating and thus possibly damaging specific critical circuit portions may be caused.

The problem of imbalanced heat dissipation capabilities of an external cooling system with respect to their waste heat produced by a complex semiconductor device may even be exaggerated in situations, in which so-called hot spots may be present in the semiconductor device, which may not directly be similarly coupled to an efficient heat sink. That is, frequently the design of complex integrated circuits requires the provision of fast switching transistors in critical signal paths to be implemented at certain device areas, without having the possibility to appropriately similarly connect these critical circuit areas with high-performance heat dissipation areas. In this case, during operation local high-temperature areas are generated with less than desired heat spreading functionality, thereby requiring operation of the device such that a critical temperature in these hot spots will not be exceeded for a given heat dissipation capability of an external cooling mechanism. In particular with the introduction of sophisticated low-k dielectric based metallization systems in complex semiconductor devices and/or with the application of ever increasing current densities in active semiconductor devices, such as power MOS transistors, and the like, the lateral thermal conductivity capabilities of the semiconductor device itself may not be sufficient so as to allow a sufficient lateral heat distribution in order to more fully exploit the heat dissipation capabilities of an external cooling system.

Consequently, since a substantially linear increase of the total thermal power margins may be observed with the scaling of the device dimensions, while, on the other hand, the power density may over-proportionally increase, a corresponding adaptation of heat dissipation systems may be required, in particular for initially transferring heat from the actual semiconductor device to a carrier substrate or package.

FIG. 1A schematically illustrates a conventional semiconductor device 150 in a substantially "packaged" state, in which a semiconductor chip 120 is attached to an appropriate carrier substrate 110, which may represent any appropriate carrier material for receiving the semiconductor chip 120 and to provide an infrastructure of electrical connections so as to allow the routing of signals and power from and to the semiconductor chip 120. In the conventional example of FIG. 1A the semiconductor chip 120 is attached to an appropriately configured surface 110A of the substrate 110 by means of a direct bond mechanism, in which solder balls 121 or any other appropriate contact structure connect to a complementary contact structure (not shown) of the carrier 110. In this case, the contact elements 121, which are frequently provided in the form of solder bumps, ensure mechanical, electrical and thermal contact to the carrier substrate 110, which, however, for high-performance devices may not be sufficient for transferring a desired amount of heat generated in the semiconductor chip 120 to the periphery. Therefore, in an attempt to additionally contribute to superior mechanical and thermal connectivity between the chip 120 and the carrier substrate 110 a filler material 160 is provided that enhances adhesion and/or thermal conductivity. Moreover, in sophisticated applications the heat dissipation capability obtained by connecting the chip 120 to the substrate 110 by means of the contact elements 121 and the filler material 160 may not be sufficient and additional heat transfer is accomplished by connecting a cooling element 140 to the chip 120 by means of an intermediate filler material 130 having superior heat conductivity characteristics. Although in this arrangement both main surfaces of the semiconductor chip 120 are used for heat dissipation it appears that in particular the characteristics of the filler materials 160 and 130 are of great importance with respect to the finally achieved heat dissipation capabilities of the device 150. Therefore, great efforts are being made in identifying appropriate filler materials having superior thermal conductivity, while still complying with the requirements imposed by volume production techniques in terms of costs and processability.

In many applications still other less sophisticated contact or packaging regimes are used, when a direct electrical connection of the contact structure of the semiconductor chip to an appropriate carrier substrate is not required. For example, high power semiconductor devices are frequently electrically connected by wire bonding, while the thermal and mechanical connection to a lead frame is accomplished by means of an appropriate filler material or glue material.

FIG. 1B schematically illustrates a corresponding configuration, in which the semiconductor device 150 is illustrated such that the semiconductor chip 120, which may comprise power elements, and the like, is mechanically attached to the surface 110A of the carrier substrate 110, provided in the form of a lead frame, by means of the filler material 160, which may thus represent any appropriate adhesive or glue material, while electrical contact of the chip 120 to the periphery may be accomplished by any appropriate contact structure formed on the opposite surface of the chip 120. In this case, the filler material 160 may require superior thermal conductivity, since the main part of the waste heat generated in the semiconductor chip 120 has to be transferred to the lead frame 110. For example, in particular in the configuration as shown in FIG. 1B well-established lead based solder materials are presently frequently used as the filler material 160, in particular when the semiconductor chip 120 represents a power circuit, while in less thermally demanding applications and also in small signal applications the filler material 160 is provided as an organic material, possibly including highly conductive metal particles, such as silver particles, and the like. Using an organic adhesive or glue material in combination with an appropriate metal species results in moderate thermal conductivity at low cost, may, however, not be compatible with thermal requirements of cutting edge semiconductor devices and future device generations in the small signal regime. On the other hand, in high-power applications the usage of lead based filler materials, such as lead/tin (Pb/Sn) based solder materials, ensures superior processability with respect to robust and well established process conditions, however, faces increasingly legal restrictions associated with the usage of lead in volume production products.

Therefore, a plurality of new materials has been proposed in order to meet the challenges of upcoming legal requirements and superior performance with respect to thermal connectivity and processability. For example, United States Patent Application Publication No. 2008/0202386 A1 (incorporated by reference) describes the use of self-orienting microplates in a thermally conductive material that is applied between the semiconductor chip and a carrier substrate as a thermal paste or adhesive. In some specific applications the material of the microplates comprises carbon and the form of graphite or graphene rolled into a fiber in order to obtain carbon nanotubes.

In view of the situation described above, the present disclosure relates to techniques for attaching a microstructure device chip to an appropriate carrier material while avoiding or at least reducing the effects of one or more of the problems identified above.

SUMMARY

Generally, the present disclosure relates to techniques and microstructure devices, in which the device internal thermal conductivity may be increased. In this context a microstructure device is to be understood as any device comprising a chip or die including at least one microelectronic component that produces heat during operation, wherein the chip is mechanically connected to an appropriate carrier material, such as a package, a lead frame, and the like, in order to establish a mechanical robust configuration of the microstructure device. For example, semiconductor device chips, which may have incorporated therein complex circuitry, individual power circuit elements or any combination thereof, may be considered in the context of the present application, as microstructure device chips requiring mechanical and thermal connection to an appropriate carrier material.

In order to at least partially address the above specified problems that are associated with conventional filler materials for die attachment the present invention considers the usage of graphene as new filler material for connecting microstructure device chips to an appropriate carrier material due to the outstanding characteristics of graphene. Generally, graphene can be considered as a monolayer of carbon atoms that are arranged in a hexagonal or honeycomb structure. Hence, a typical thickness of the monolayer is 0.3 nm. Moreover, graphene has a high thermal conductivity that is approximately 5 times that of copper, while the electrical conductivity has same order of magnitude as silver. Furthermore, a maximum current density of 300 times that of silver is achievable. Moreover, optical transparency is at least as high as that of ITO (indium tin oxide), while the Young's modulus of graphene is approximately 3 times that of steel. According to the principles disclosed herein in particular the very high thermal conductivity of graphene is taken advantage of and flakes of graphene are used so as to obtain a desired high thermal conductivity of filler materials used for chip or die attachment, thereby also allowing at least the partial replacement of specific metal species, such as lead, silver, and the like in filler materials, which are frequently used in conventional glue and adhesive materials for die attachment.

According to one aspect a microstructure device comprises a substrate having a surface and a microstructure device chip positioned above the surface, wherein the microstructure chip has formed therein at least one circuit element. Moreover, the microstructure device comprises an intermediate heat transfer layer positioned between the surface of the substrate and the microstructure device chip, wherein the intermediate heat transfer layer comprises graphene flakes.

According to this aspect the intermediate heat transfer layer includes graphene flakes, which are to be understood as individual pieces of monolayers of carbon in a substantially planar configuration, i.e. without being deformed into a three-dimensional configuration, such as a nanotube, wherein the term graphene flake may also encompass any substantially planar hexagonal carbon structure, in which additional defects or atoms or molecules may be present so as to specifically adjusting the overall characteristics of the carbon flake. For example, the lateral dimensions of a graphene flake may range from several nanometers, for instance 5 nm, to several tens of nanometers or even several micrometers or several tens of micrometers. Such graphene flakes may readily be formed on the basis of well-established chemical exfoliation techniques, for instance by producing graphene powder having dimension range from few nm to several hundreds of nm.

By incorporating graphene flakes into appropriate base materials, such as adhesive or glue materials typically used in die attachment procedures, superior thermal conductivity may be achieved due to the exceptional characteristics of graphene, as discussed above. In other cases, when a substantially electrical conductive base material is to be used the provision of individual graphene flakes ensures a high degree of compatibility with conventional process recipes and strategies, since the characteristics of the base material may substantially be preserved. In this manner, well-established process strategies may still be applied, while, on the other hand, critical metal species, such as lead, and the like may be replaced, at least to a high degree.

In one advantageous embodiment the intermediate heat transfer layer comprises a glue substance so as to also mechanically connect, in addition to the superior thermal coupling, the microstructure device chip to the substrate. Accordingly, the intermediate heat transfer layer may also serve for mechanically fastening the chip to the substrate, thereby acting as a replacement material for a plurality of die attachment materials, such as lead/tin-based solder materials, organic adhesives including silver particles, and the like.

In one illustrative embodiment a concentration, expressed in atomic percent, of carbon atoms in the intermediate heat transfer layer is greater than a concentration of silver (Ag) atoms and/or lead (Pb) atoms. Consequently, in these embodiments the amount of critical and/or expensive metal species may be reduced compared to conventional filler materials, thereby allowing to comply with restrictive legal regulations, for instance concerning the usage of lead in solder and die attachment materials, while still providing for superior thermal characteristics and compatibility with well-established process techniques and process tools.

In one illustrative embodiment, the intermediate heat transfer layer is a lead-free material. As previously discussed, frequently metallic compounds are used for attaching chips to a lead frame, in particular in power applications, due to the superior processability and heat conductivity of such compounds. By replacing at least the critical lead by the graphene flakes the strict legal requirements of present and future device generations may be met, while at the same time increasing overall performance of the corresponding chip-substrate connection. It should be understood that the term "lead-free" is to encompass minute amounts of lead in the filler material, which may be incorporated due to unavoidable imperfections during the entire processing of the microstructure device and the heat transfer layer. It should be appreciated, however, that this term excludes materials having a lead concentration of more than 0.1 atomic percent.

In one illustrative embodiment the intermediate heat transfer layer is formed above substantially the entire surface area of the surface. In this manner, the superior thermal conductivity of graphene is efficiently exploited, since a pronounced layer internal heat distribution may be achieved, thereby highly efficiently transporting heat energy from the microstructure device chip to the entire lead frame. That is, by covering at least a significant portion of the entire available surface of the lead frame the heat dissipation capability of the lead frame is significantly enhanced compared to a design, in which the heat transfer layer is provided so as to cover a surface area that substantially corresponds to the area of the chip, since typically the heat transfer layer including the graphene flakes has a significantly greater lateral thermal conductivity compared to the material of the lead frame.

In a further illustrative embodiment the intermediate heat transfer layer comprises a first portion including a first plurality of the graphene flakes having a first averaged spatial orientation that is aligned to a first spatial direction. In this embodiment the graphene flakes that have to be understood as substantially two-dimensional objects, as discussed above, have, on average, a specific spatial orientation, thereby even further enhancing, for instance, thermal conductivity of the heat transfer layer along the specific first spatial direction. For example, if the first spatial direction is substantially aligned to the lateral extension of a significant part of the heat transfer layer, i.e. the first spatial direction lies within the plane of the significant part, the lateral or "in-plane" heat conductivity may further be enhanced due to the average alignment of the graphene flakes. Consequently, in this configuration an even further enhanced lateral heat distribution ability of the heat transfer layer is achieved.

In a further illustrative embodiment the first spatial direction is perpendicular to the surface. That is, the spatial orientation of the graphene flakes is selected so as to enhance thermal conductivity along a direction that is perpendicular to the surface of the substrate, which will also be referred to as "across-plane" direction, and to a surface of the microstructure chip, thereby enhancing the "vertical" or across-plane heat transfer between these two components.

In one illustrative embodiment the intermediate heat transfer layer further comprises a second portion including a second plurality of graphene flakes having a second averaged spatial orientation that is aligned to a second spatial direction that is different from the first spatial direction. That is, the first and second portions of the heat transfer layer may have enhanced thermal conductivity along different spatial directions, thereby enabling a specific adaptation of non-uniform heat transfer capabilities to the specific arrangement and requirements of the microstructure device chip and the substrate. For example, in one illustrative embodiment the first and second spatial directions are substantially orthogonal to each other, thereby providing different areas in the heat transfer layer having superior in-plane and across-plane heat conductivities, respectively. In other illustrative embodiments the heat transfer layer may have layer portions, which themselves are arranged as a three-dimensional configuration, wherein in each of the different portions the orientation of the graphene flakes is selected so as to obtain superior in-plane thermal conductivity, which, in total, results in increased thermal conductivity in different spatial directions in the three-dimensional configuration of the heat transfer layer. For example, if the heat transfer layer covers differently oriented portions of said surface, for instance a top surface portion and one or more side surface portions of a lead frame, the resulting configuration of the heat transfer layer may be considered as a three-dimensional construct, wherein the selection of an in-plane orientation of the graphene flakes in each of the portions results in superior thermal conductivity in different spatial directions.

It should be appreciated, however, that even different spatial orientations in two or more of the three-dimensionally arranged layer portions may be implemented, if considered appropriate. For example, in some layer portions an orientation of graphene flakes may be selected so as to obtain superior across-plane conductivity, while in other layer portions superior in-plane conductivity may be selected.

In one illustrative embodiment the first and second portions are provided laterally adjacent to each other, thereby enabling a flexible adjustment of the overall thermal conductivity with respect to the specific arrangement of the microstructure device. For instance, a portion of superior in-plane thermal conductivity may result in superior lateral heat distribution, for instance over an increased surface area compared to the initial heat generating chip surface, while a laterally adjacent layer portion of superior across-plane thermal conductivity may allow an efficient transfer of heat into the lower lying material of the substrate.

In another illustrative embodiment the first and second portions form a stacked configuration. That is, the portions with different spatially oriented graphene flakes are formed on top of each other, thereby also obtaining, in total, a superior heat conductivity, wherein, for instance, superior lateral conductivity may result in superior lateral distribution of heat, which may then efficiently conducted into the depth of the substrate material.

In a further illustrative embodiment the microstructure device further comprises a second microstructure device chip positioned above the microstructure device chip and a second intermediate heat transfer layer formed between the microstructure device chip and the second microstructure device chip, wherein the second intermediate heat transfer layer comprises graphene flakes. In this configuration a stacked microstructure device, such as a semiconductor device including two or more semiconductor chips, which are arranged in a stacked configuration, may efficiently be thermally coupled to each other and to the substrate by means of appropriate heat transfer layers having incorporated therein graphene flakes. In this manner, the overall heat management in complex three-dimensional semiconductor packages may efficiently be improved due to the superior heat conductivity characteristics of graphene, wherein still well-established process techniques and process tools may be used in applying the material of the heat transfer layer between the individual microstructure chips.

According to another aspect the above-identified object is solved by a method. The method comprises preparing a thermally conductive filler material so as to comprise graphene flakes and positioning a microstructure device chip above a surface of a substrate. Moreover, the method comprises providing the filler material between the microstructure device chip and the substrate.

As already discussed above, preparing a filler material on the basis of graphene flakes and any appropriate base material, such as a metal based material or a glue material or an adhesive material, for instance using organic substances, and the like, enables complete or at least partial replacement of critical species, such as lead, and the like. On the other hand, the fundamental characteristics of the base material are not significantly modified, thereby still allowing the application of well-established process tools and process techniques for applying the filler material.

For instance, preparing the thermally conductive filler material comprises using a glue substance and incorporating therein the graphene flakes. In this manner, mechanical attachment of the microstructure device chip to the substrate is accomplished on the basis of any appropriate process technique.

In one illustrative embodiment providing the filler material between the surface and the microstructure device chip comprises, prior to positioning the microstructure device chip above the surface, the formation of the filler material as a layer above a wafer that comprises a plurality of chips including the microstructure device chip. That is, the filler material may appropriately be formed on the wafer, for instance by any appropriate deposition technique, such as spin coating or laminating directly on a wafer surface, thereby providing for a highly efficient process of applying the graphene based filler material. For example, the wafer may then be diced into the individual chips, which may then be attached to appropriate carrier substrates, wherein the filler material may provide for superior mechanical and thermal contact between the chip and the substrate. In other cases, package regimes on wafer-level may be applied, in which appropriate carrier substrate components may be attached to the wafer having received the graphene based filler material prior to dicing the composite configuration of wafer and package assembly. Also in this case a mechanical and thermal coupling of the chip and the substrate may be achieved on the basis of a highly efficient process technique.

In one illustrative embodiment the thermally conductive filler material is provided so as to substantially completely cover the surface under consideration in order to enhance the lateral heat distribution, thereby significantly relaxing the situation with respect to hot spots in complex integrated circuits, as already discussed above.

In one illustrative embodiment providing the filler material comprises depositing the filler material in a deformable state and exposing a first portion of the filler material in the deformable state to a first spatially oriented force field so as to allow graphene flakes in the first portion to take on a first averaged spatial orientation corresponding to the first force field. In this manner, a desired preferred orientation of the graphene flakes and thus of the thermal conductivity may be established. The spatial orientation of the graphene flakes may be accomplished by appropriately modifying the "response" of individual flakes to the external force field, for instance by adding one or more molecules of specific physical characteristics to the graphene flakes at least during exposure to the external force field. For example, the basically non-polar behavior of graphene may significantly be modified by having polar molecules adhere to the flakes or by otherwise incorporating atoms or molecules of specific type into the molecular structure of graphene. For instance, water molecules may adhere to a graphene basis cell, thereby imparting polar characteristics to the graphene flake and thus allowing the flake to appropriately react to an external force field, such as an electrostatic field, a dynamic magnetic field, acoustic waves, and the like.

In one illustrative embodiment, the method further comprises curing the filler material so as to permanently set the averaged spatial orientation. That is, the filler material may be treated by radiation, heat, and the like, so as to at least significantly increase viscosity of the base material, thereby also "freezing" the current spatially aligned orientation of the graphene flakes. In this manner, the desired spatial non-uniformity caused by the spatially aligned flakes, may permanently be preserved in order to establish a spatially non-uniform thermal conductivity.

In a further illustrative embodiment the method further comprises exposing a second portion of the filler material to a second spatially oriented force field so as to allow graphene flakes in the second portion to take on a second averaged spatial orientation corresponding to the second force field. Consequently, two or more different spatial orientations may be established in different material portions so as to specifically design at least the thermal characteristics of the filler material with respect to the application under consideration. For example, as already discussed above, laterally and/or vertically arranged portions of the filler material may receive differently adjusted preferred heat conductivity characteristics in order to optimize the total thermal behavior of a packaged microstructure device.

In an embodiment, a method comprises: depositing a layer a filler material that is thermally conductive and comprises graphene flakes on a substrate wafer; mounting a plurality of semiconductor device chips to the substrate wafer with the deposited layer positioned between each semiconductor device chip and the substrate wafer; and dicing the substrate wafer to produce a plurality of die structures, with each die structure including at least one semiconductor device chip attached to a diced portion of the substrate wafer by said deposited layer of filler material.

BRIEF DESCRIPTION OF THE DRAWINGS

Further embodiments of the present disclosure are defined in the appended claims and will become more apparent with the following detailed description when taken with reference to the accompanying drawings, in which:

DETAILED DESCRIPTION OF THE DRAWINGS

Figure 2A:
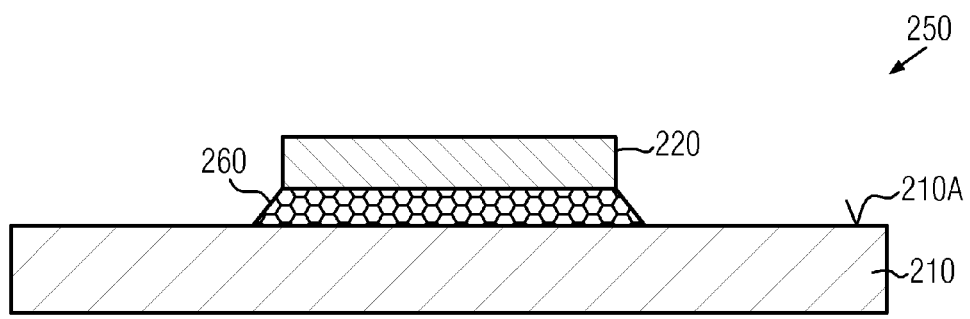
FIG. 2A schematically illustrates a cross-sectional view of a microstructure device including a chip and a carrier substrate with an intermediate heat transfer layer including graphene flakes.

FIG. 2A schematically illustrates a cross-sectional view of a microstructure device 250 comprising a device chip 220 that is attached to a surface 210A of a substrate 210, which may represent a lead frame, a package substrate, and the like. It should be appreciated that the chip 220 may comprise at least one circuit element, such as a transistor, and the like, that generates significant heat upon operation. For example, the chip 220 may have incorporated therein one or more power transistors, IGBTs, and the like, while in other cases sophisticated control circuitry may be incorporated in the chip 220, possibly in combination with one or more power circuit elements. The chip 220 is attached to the surface 210A by means of a heat transfer layer 260 or filler material, which comprises a plurality of graphene flakes. To this end, the layer 260 may comprise an appropriate glue material or adhesive, for which organic materials are well established in the art. In other cases, the layer 260 may comprise a metal based material, such as a solder material, wherein the graphene flakes may be used to replace, at least partially, critical metal species compared to conventional materials, thereby providing for superior heat conductivity and also allow compliance with legal regulations, for instance with respect to the reduction or avoidance of critical species, such as lead, as already discussed above.

Figure 2B:
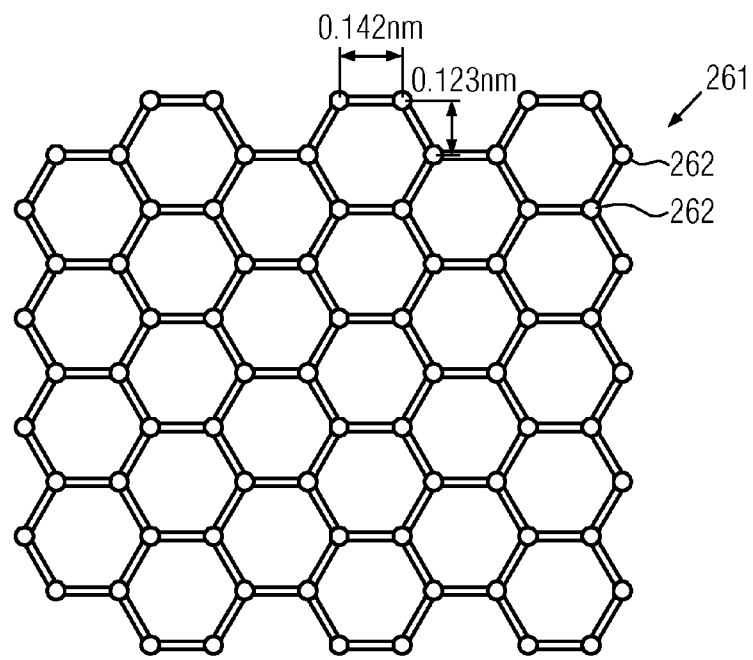
FIG. 2B schematically illustrates a top view of a graphene flake.

FIG. 2B schematically illustrates a top view of a graphene flake 261, which mainly comprises carbon atoms arranged in a honeycomb structure with lattice constants of 0.142 nm and 0.123 nm, as shown. Typically, the flake 261 has lateral dimensions of several nanometers up to several micrometers, depending on the overall requirements and the process of forming individual graphene flakes 261. It should be appreciated that the flakes 261 may have different size within the above-identified range or may have substantially identical lateral sizes, depending on the manufacturing procedure. Moreover, as will be discussed later on, one or more of the graphene flakes 261 may comprise additional components in the form of molecules, lattice defects, dopant atoms and the like in order to impart desired physical characteristics to the flakes 261. Furthermore, it should be appreciated that the flakes 261 represent substantially two-dimensional objects, i.e. plane-like objects, thereby having significantly different characteristics when dissolved in a base material compared to, for instance, three-dimensional nanotubes. It should be appreciated, however, that depending on the lateral size of the flakes 261 a certain deformation may take place, however, without forming a three-dimensional object, such as a nanotube, and the like.

The graphene flakes 261 may be formed by chemical exfoliation, which produces graphene as powder composed by billions of flakes having different lengths and a thickness in the range of approximately 1 nm. The powder may be considered as bi-dimensional graphene powder and may be added to traditional adhesives and thermally conductive compounds, for example to substitute lead or silver.

Furthermore, prior to or during the generation of the flakes 261, if required, modified portions may be formed in the flakes 261 in order to obtain specifically designed physical characteristics. To this end, an intentional modification of the lattice structure may be induced, for instance by particle bombardment, and the like, thereby achieving locally a deviation from the planar configuration of the involved region allowing the deposition of electrical charges therein. For example, some bondings in the hexagonal structure may be broken and rebuilt so as to obtain the desired topography. Additionally or alternatively dopant species may be incorporated in order to obtain more complex lattice irregularities, which may also contribute to a configuration of desired physical characteristics that provide for spatially non-uniform response to an external force, as will be described later on.

As discussed above, the flakes may be provided as a powder, possibly mixed with other components. Due to the substantially two-dimensional configuration of the flakes schematically represented by 261 well established base materials in the form of adhesives and the like may be used as a carrier material in order to provide the material for the heat transfer layer 260. It should also be appreciated that the flakes 261 may be incorporated into a metal based compound by, for instance, solving the flakes in an appropriate liquid, which may be mixed with the metal base compound in a liquid state, while in other cases the graphene flakes may be provided in the form of a powder, which may be incorporated into a metal based compound when being in a liquid state.

Figure 1A:
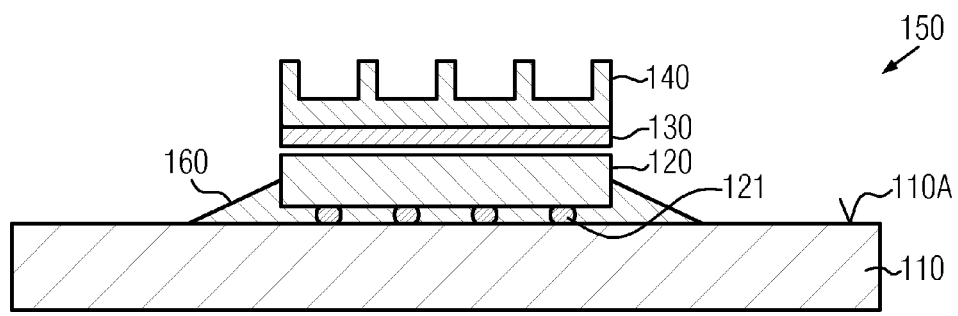
FIGS. 1A and 1B schematically illustrate cross-sectional views of packaged semiconductor devices with thermally conductive die attachment materials provided according to conventional techniques.
Figure 1B:
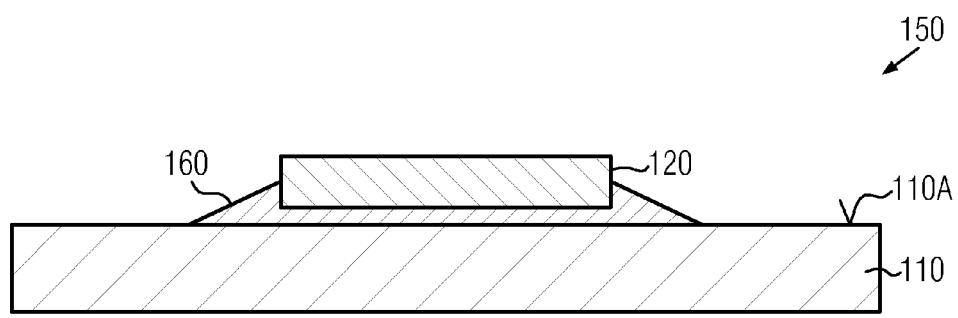
Figure 2C:
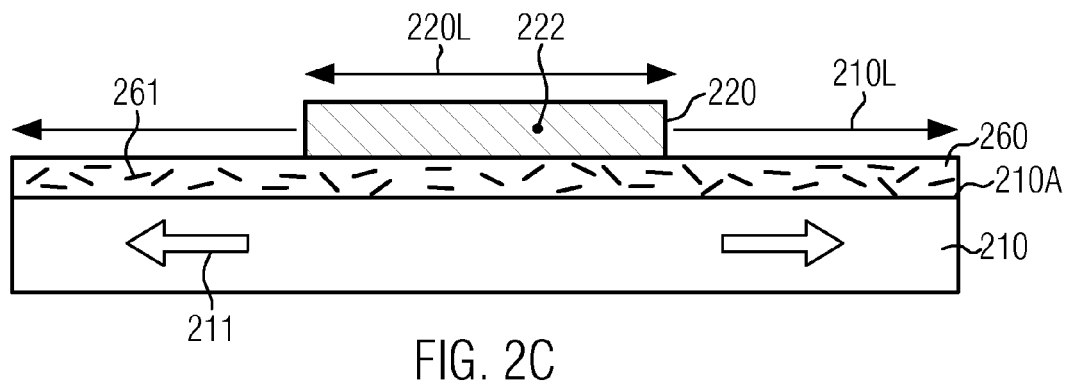
FIGS. 2C and 2D schematically illustrate cross-sectional views of the microstructure device according to further illustrative embodiments, wherein a heat transfer layer with graphene flakes is provided across a significant surface area of a carrier material and a wafer, respectively.

FIG. 2C schematically illustrates a cross-sectional view of the device 250 according to one illustrative embodiment, in which the heat transfer layer 260 is formed so as to cover the entire surface 210A, thereby obtaining superior lateral heat distribution within the layer 260 due to the moderately high in-plane thermal conductivity of the layer 260 due to the presence of the flakes 261. It should be appreciated that covering the available surface 210A, or at least a significant portion thereof that is greater than two times the area of the chip 220, by the layer 260 may provide advantages compared to conventional designs, as for instance shown in FIGS. 1A and 1B, since typically the layer 260 may have a greater lateral thermal conductivity compared to the material of the substrate 210. Therefore, the heat generated by the chip 220 may be distributed more effectively within the substrate 210, as indicated by arrows 211. That is, typically the lateral dimension 210L of the substrate 210 is significantly greater than the lateral dimension 220L of the chip 220. Conventionally, however, the "vertical" heat transfer is obtained by an intermediate material and thereafter the lateral heat distribution is accomplished by the substrate. In this manner, only a very limited dissipation of heat generated in restricted areas, such as hot spots, within a sophisticated semiconductor chip may be achieved. Contrary to this conventional regime, a hot spot 222 in the chip 220 may be less critical, since heat may be distributed in the lateral direction significantly more efficiently by means of the layer 260 comprising the flakes 261. Consequently, for a given geometric configuration of the device 250 superior reliability is achieved during operation, which is an important aspect for many technical fields, such as automotive applications, power applications or generally industrial applications.

In order to form a continuous layer for the material 260 any appropriate base material may be used that allows the deposition on large-area surfaces. To this end, spin coating, dipping, and the like may be used as appropriate deposition techniques. It should be appreciated that the layer 260 may also cover other surface portions of the substrate 210 depending on device requirements and deposition techniques used.

Figure 2D:
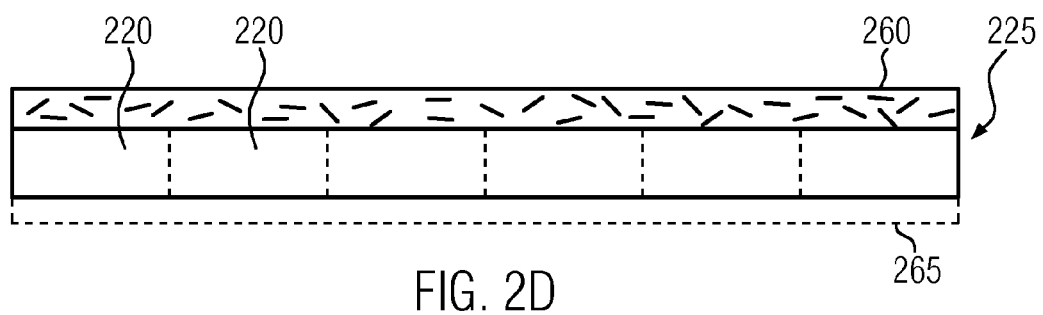

FIG. 2D schematically illustrates a cross-sectional view of a configuration, in which the heat transfer layer 260 may be applied as a continuous layer by using an appropriate base material that is prepared so as to contain graphene flakes, as discussed above. To this end, the base material may be prepared so as to be in a moderately low viscous state, in which the material may be applied by an appropriate deposition technique, such as spin coating, on a substrate, which in the present embodiment is represented by a wafer 225 comprising a plurality of chips 220. Consequently, the layer 260 may be applied on the wafer 225 prior to dicing the wafer, thereby allowing highly efficient process strategies. Thereafter, the wafer 225 may be diced to obtain the individual chips 220, which in turn may be attached to an appropriate substrate, as for instance discussed above. In other cases, an appropriate package or carrier substrate may be attached to the wafer 225 and the dicing may be performed on the composite structure so as to obtain "packaged" devices chips after dicing the wafer. Therefore, any packaging techniques on wafer-level may efficiently be applied, while the layer 260 insurers for superior heat distribution and dissipation capabilities. Furthermore, as illustrated in the figure an additional layer 265 may be formed on the opposite surface of the wafer 225, if this surface of the chips is to be contacted with or to be attached to a further heat dissipating substrate. Generally the lateral heat dissipation capabilities of the chips and thus the thermal relaxation of hot spots may be enhanced by providing the one or more layers 260, 265 on wafer level, since device topography of sophisticated metallization systems and the like may be taken account of more efficiently.

Generally, due to the presence of the graphene flakes the layer 260 may have superior lateral heat distribution characteristics, i.e. the in-plane heat distribution may be moderately pronounced. This non-uniformity of the heat conductivity characteristics may even further be increased, if desired, by even more efficiently adjust the spatial orientation of the flakes with respect to the thermal conductivity requirements.

Figure 2E:
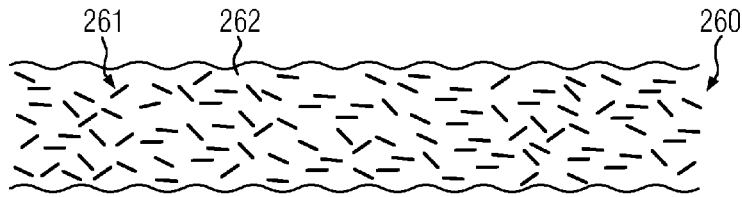
FIGS. 2E and 2G schematically illustrate process steps for implementing a preferred spatial orientation of the graphene flakes by exposing the flakes to an external force field.

FIG. 2E schematically illustrates a cross-sectional view of the layer 260 including an appropriate base material 262, such as a metal based solder material, an organic adhesive, and the like, in which a plurality of the graphene flakes 261 are more or less randomly distributed so that a substantially random average orientation of the flakes for each unit volume in the layer 260 is obtained. As already discussed above, the basically non-polarized behavior of the flakes 261 may be modified so as to allow the coupling of the flakes 261 to an external force field, which may have an appropriate field distribution in order to adjust a desired spatial distribution of orientations of the flakes 261. It should be appreciated that an averaged spatial orientation of a plurality of the flakes 261 within a certain portion is to be understood such that the substantially two-dimensional configuration of all flakes of the portion under consideration has substantially the same spatial alignment. For example, if the flakes are understood as two-dimensional objects the planes of these two-dimensional objects are substantially parallel to each other with a maximum deviation of +/−10° from a central direction. A portion is to be understood as a volume comprising at least 10 graphene flakes. When therefore all of the flakes within a portion under consideration are oriented with their planes according to the above specified angular range these flakes are considered as being aligned to the central spatial direction.

Figure 2F:
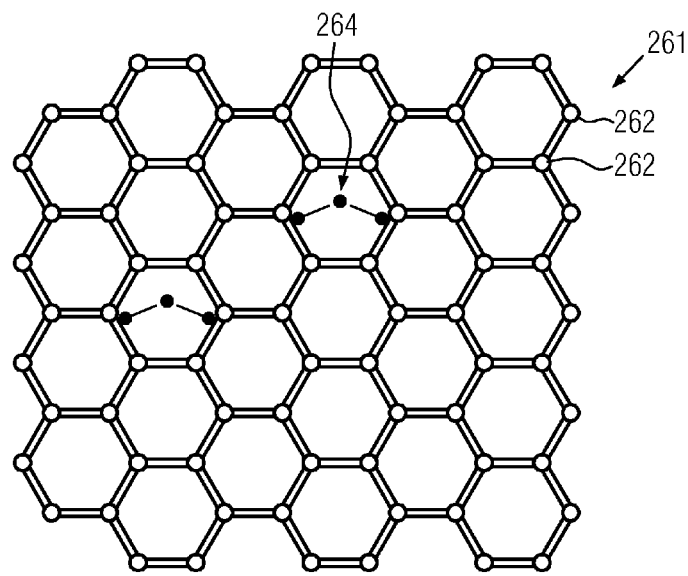
FIG. 2F schematically illustrates a top view of a graphene flake, to which one or more molecules adhere to the flake in order to impart specific characteristics to the flake thereby allowing the flake to respond to an external force field.

FIG. 2F schematically illustrates one mechanism for imparting to the flakes 261 a pronounced spatially non-uniform behavior in response to an externally applied force field. To this end, polar molecules 264, such as water or any other type of molecules having a pronounced dipole moment, may adhere to the one or more of the base cells of the flakes 261, which may be accomplished by wetting the flakes 261 or otherwise contacting the flakes 261 with a substance including appropriate polar molecules. For example, a plurality of strategies has been established in the art so as to "dope" graphene with appropriate atomic or molecular species in order to modify the physical behavior. Moreover, as previously discussed, lattice defects may intentionally be introduced in the flakes 261, which in combination with additional molecules 264 may result in a pronounced non-uniform behavior upon applying an external force field, such as an electrical field.

Figure 2G:
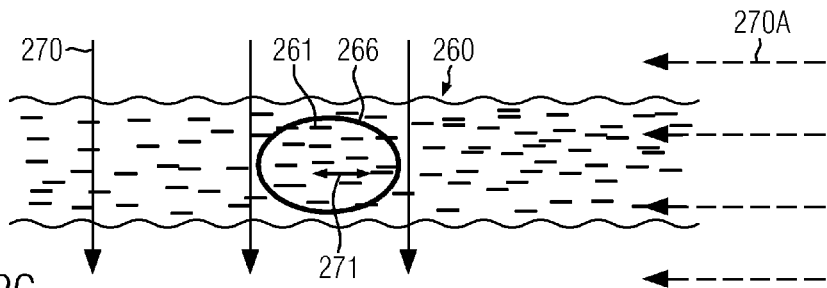

FIG. 2G schematically illustrates the layer 260 when applying an external force field 270 and/or 270A, which may represent different types of physical forces. The one or more fields may interact with the flakes 261, which may have incorporated therein an appropriate mechanism for responding to an external force so as to take on a specific spatial alignment with respect to the external force. Consequently, in a given portion 266 an average spatial orientation of the flakes 261 may be achieved, which is aligned with respect to a specified spatial direction, indicated as 271. For the case of the external force 270 the interaction with the polarized flakes 261 is such that the spatial direction 271 is oriented substantially perpendicular to the direction of the external force 270. In other cases, the interaction may be such that the flakes 261 may align in a substantially parallel manner to an external force, as is for instance schematically illustrated for the external force 270A. To this end, different polarizing mechanisms may be applied to the flakes 261 for a given type of external force, such as electrostatic force, and the like, or different types of external force may be used in order to obtain a different spatial alignment 271 for a given polarizing mechanism in the flakes 261. It should be appreciated in this respect that graphene is currently the subject of great interest in determining and adjusting physical characteristics, wherein many of these mechanisms may be applied so as to design the response of the flakes to an external force. It should be noted that corresponding mechanisms do not need to be permanent, but are required only upon actually adjusting the spatial alignment of the flakes 261.

Figure 2H:
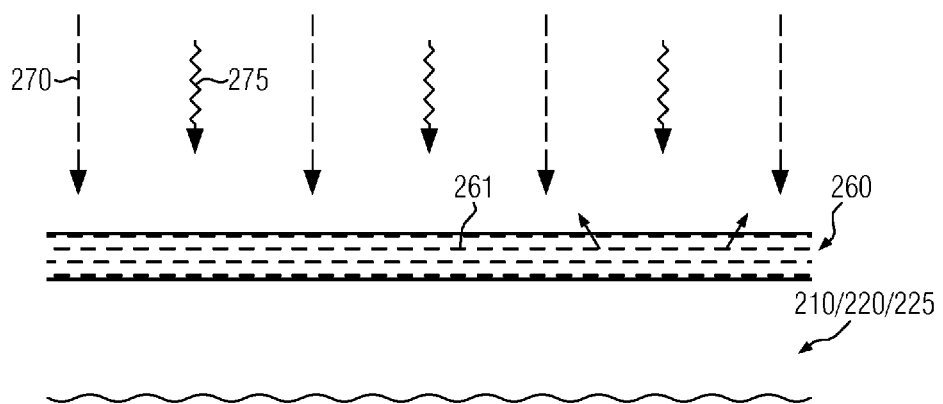
FIGS. 2H and 2I schematically illustrate cross-sectional views of a microstructure device upon forming a heat transfer layer having portions with differently spatially oriented graphene flakes.

FIG. 2H schematically illustrates the layer 260 after deposition onto an appropriate substrate, such as the substrate 210, the chip 220 or the wafer 225, as previously discussed. To this end, the material of the layer 260 is applied in a low-viscous state, as discussed above, by any appropriate deposition technique. Thereafter, the external force 270 is established so as to obtain the desired spatial orientation of the flakes 261, wherein in the example shown in FIG. 2H the polarising mechanisms of the flakes 261 in combination with the external field 270 is selected so as to obtain a spatial alignment parallel to the layer 260, thereby establishing a superior "in-plane" thermal conductivity. That is, in this case an even increased lateral heat distribution capability for the layer 260 is accomplished. It should be appreciated, however, that the external field 270 may be oriented in any other spatial direction, if considered appropriate for correspondingly aligning the flakes 261 in the layer 260. For example, different portions of the layer 260 may be exposed to differently oriented forces, thereby realizing different spatial orientations in different portions of the layer 260.

Thereafter, a treatment 275 may be applied in order to cure the layer 260, thereby significantly increasing the viscosity of the material, which in turn will result in a reliable adjustment of the spatial orientation of the flakes 261. To this end, radiation may be applied and/or heat may act on the layer 260, thereby achieving a stabilization of the layer 260 and obtaining the desired mechanical characteristics, while at the same time the spatial orientation of the flakes 261 is fixed. During the treatment 275 the external force 270 may be preserved or may be activated so as to induce the desired spatial alignment as long as the flakes 261 or movable within the base material of the layer 260. As discussed above, if different portions of the layer 260 have been exposed to differently aligned external forces, a corresponding pattern of different portions is obtained, each portion having a high thermal conductivity in a direction defined by the external force previously applied to the specific layer portion under consideration.

Figure 2I:
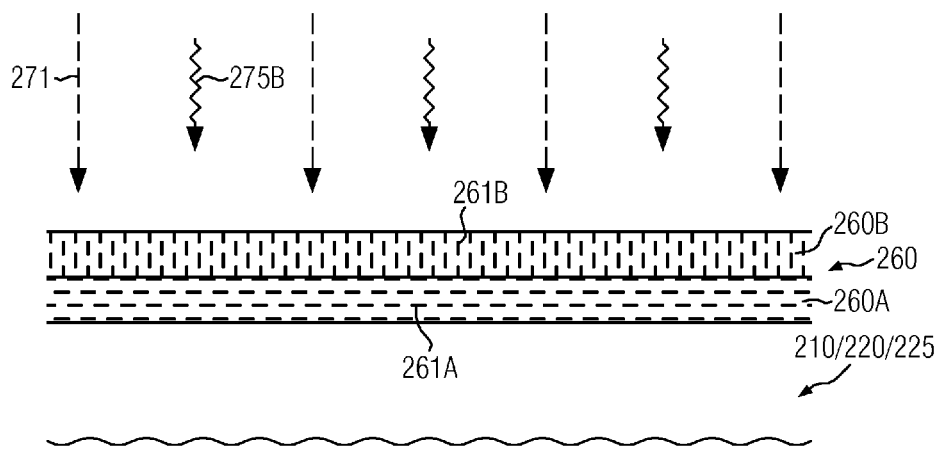

FIG. 2I schematically illustrates the layer 260 according to an illustrative embodiment, in which a first layer portion 260A may and a second layer portion 260B are provided as a stacked configuration, wherein each portion has a different spatial orientation of the corresponding graphene flakes. In the example shown, flakes 261A may be oriented substantially parallel with respect to the surface of the substrate or chip 210/220/225, thereby providing for superior in-plane thermal conductivity. On the other hand, the layer portion 260B may have flakes 261B, which are oriented differently, for instance substantially orthogonally, with respect to the flakes 261A, thereby providing for superior "across-plane" thermal conductivity. To this end, after having formed the layer portion 260A, for instance based on process techniques described above with reference to the layer 260 in FIG. 2H, the material of the layer portion 260B may be deposited in a low-viscous state and may be exposed to an external field 271 in combination with an appropriate curing treatment 275B, thereby achieving and fixing the spatial orientation of the graphene flakes 261B.

Figure 2J:
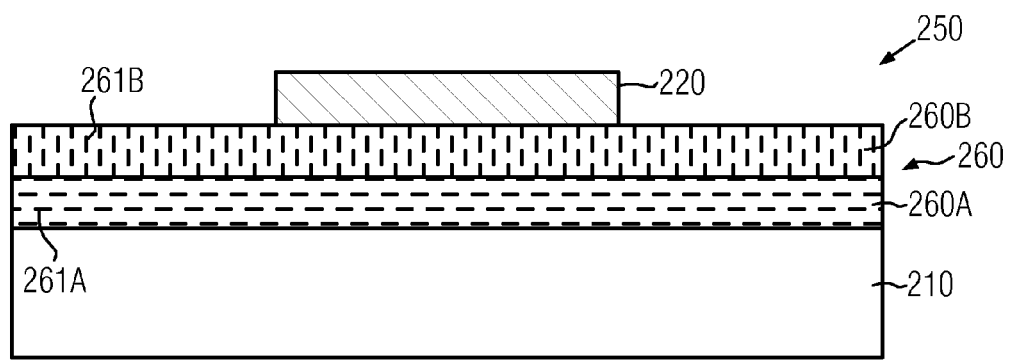
FIGS. 2J and 2K schematically illustrates cross-sectional views of the microstructure device with a heat transfer layer having portions with different spatial orientation of the graphene flakes adapted to the heat transfer requirements.

FIG. 2J schematically illustrates an embodiment of the microstructure device 250, in which the layer 260 previously described with reference to FIG. 2I may be used as a heat transfer material for the chip 220 in order to further enhance overall heat dissipation from the chip into the substrate 210. That is, by directly connecting the chip 220 with the layer portion 260B having the superior vertical or across-plane thermal conductivity, heat is efficiently transported into the lower lying areas, such as the layer portion 260A, which in turn exhibits superior lateral or in-plane thermal conductivity, thereby achieving a fast and efficient lateral distribution of heat across the entire substrate 210. It should be appreciated that the configuration of the spatial alignment of the various graphene flakes in the layer 260 is of illustrative nature only in order to demonstrate the superior flexibility in specifically designing the heat transfer characteristics of the layer 260 with respect to a specific geometric configuration and device specific requirements.

Figure 2K:
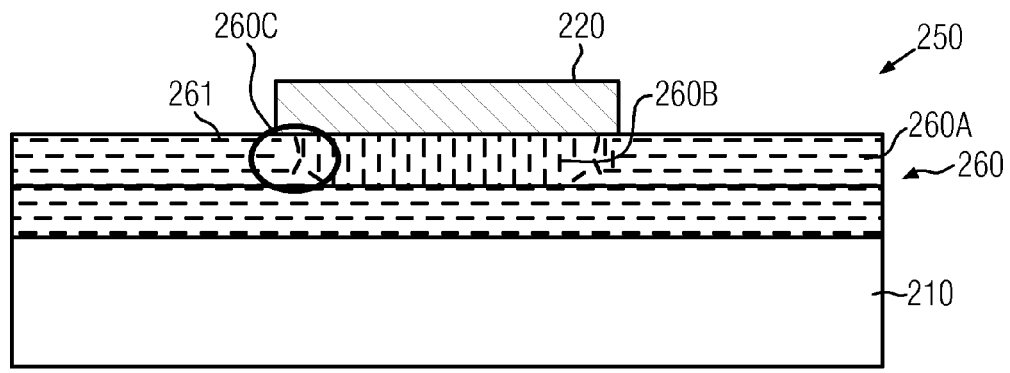

FIG. 2K schematically illustrates the device 250, in which the layer 260 may comprise the layer portion 260A with superior in-plane thermal conductivity, while the portion 260B having superior across-plane conductivity is provided at the chip 220 so as to have similar lateral dimensions. Moreover, at edge regions 260C may have random distribution of the spatial alignment of the flakes 261 or an intentionally inhomogeneous spatial alignment may be implemented so as to more efficiently thermally couple the portion 260B to the portion 260A so as to even further enhance dissipation and distribution of heat generated in the chip 220. It should be appreciated that the portion 260C may readily be implemented by using a localized inhomogeneous external field or by allowing a local randomizing of the spatial orientations of the flakes, for instance by establishing a local temperature gradient upon curing the layer portion 260B, and the like.

Figure 3:
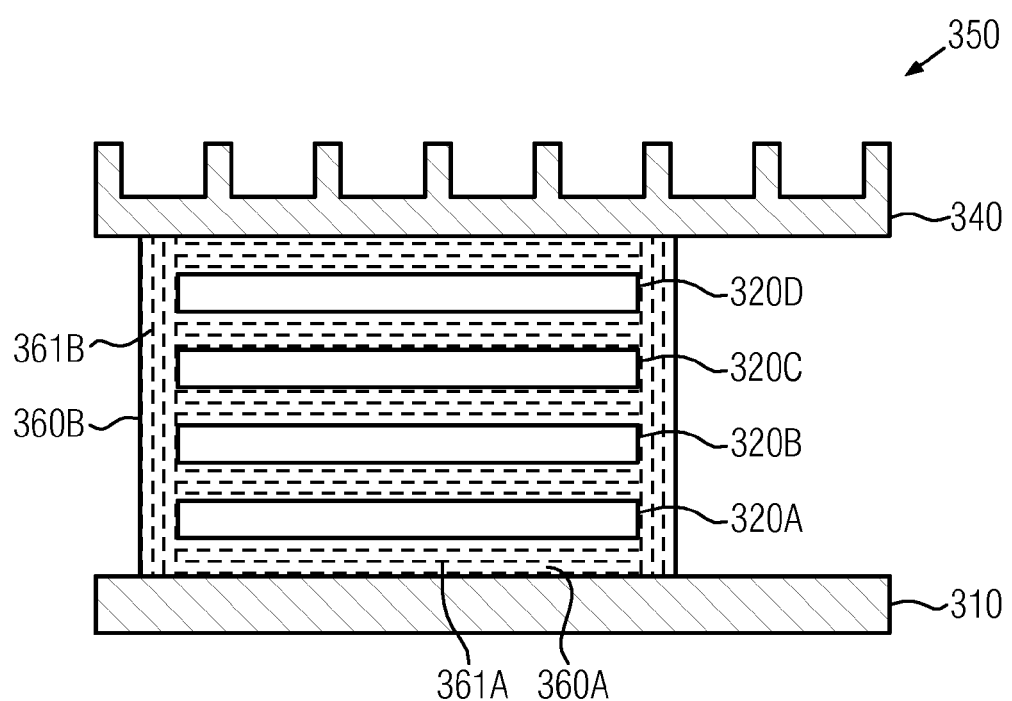
FIG. 3 schematically illustrates a cross-sectional view of a microstructure device comprising a plurality of chips in a stacked configuration with appropriately arranged filler materials having superior thermal conductivity based on graphene flakes.

FIG. 3 schematically illustrates a cross-sectional view of a microstructure device 350, in which a plurality of chips, such as semiconductor chips, may be provided, at least partially, in a stacked configuration. For example, chips 320A, 320B, 320C, 320D are positioned above a substrate 310, such as any appropriate carrier material or package, wherein appropriate intermediate filler materials or heat transfer layers 360A may be provided between the respective chips and between the chip 320A and the substrate 310. Similarly, a further substrate or passive cooling element 340 may be positioned above the chip 320D and may be mechanically and thermally coupled to the chip 320D by a corresponding filler material or heat transfer layer 360A. In the example shown, graphene flakes 361A may spatially be oriented such that superior in-plane thermal conductivity is obtained, thereby significantly improving the heat distribution capabilities within the device 350. It should be appreciated, however, that one or more of the layers 360A may have portions with different spatial alignment of the flakes 361A, as for instance discussed above. Furthermore, "vertical" layers 360B may be provided and may thus thermally and mechanically couple one or more of the chips and/or the substrate 310 with the substrate 340, thereby also achieving superior heat management within the three-dimensional device 350. For example, graphene flakes 361B within the layers 360B may be spatially oriented so as to achieve superior "vertical" heat flow, for instance by providing increased in-plane thermal conductivity, as discussed above. Consequently, in the configuration shown heat may efficiently be distributed across the individual chips in a lateral manner and may subsequently be transferred to the substrates 310 and 340 due to the superior heat conductivity of the layers 360A, 360B.

As a result, the embodiments provide techniques and devices, in which a filler material based on graphene flakes may provide for superior thermal conductivity, wherein, upon modifying the flakes so as to exhibit a certain degree of polarization, a desired spatial orientation of the graphene flakes may be induced in order to achieve highly non-uniform heat conductivity. In this manner, adhesive die attachment materials based on organic substances as well as metal based die attachment compounds may be provided with superior thermal characteristics, while critical metal species, such as lead, may completely or at least partially be replaced so as to comply with the requirements of currents and future device generations.

What is claimed is:

1. A method, comprising:
    positioning a microstructure device chip above a surface of a substrate; and
    providing therebetween a filler material that is thermally conductive and comprises graphene flakes, wherein providing comprises depositing said filler material in a deformable state and exposing a first portion of said filler material in said deformable state to a first spatially oriented force field so as to allow graphene flakes in said first portion to take on a first averaged spatial orientation corresponding to said first force field; and
    curing said filler material so as to permanently set said first averaged spatial orientation.

2. The method of claim 1, wherein said thermally conductive filler material comprises a glue substance incorporating therein said graphene flakes.

3. The method of claim 1, wherein providing comprises, prior to positioning said microstructure device chip above said surface, forming said filler material as a layer above a wafer that comprises a plurality of chips including said microstructure device chip.

4. The method of claim 1, wherein said thermally conductive filler material completely covers said surface.

5. The method of claim 1, further comprising exposing a second portion of said filler material to a second spatially oriented force field so as to allow graphene flakes in said second portion to take on a second averaged spatial orientation corresponding to said second force field, wherein curing further permanently sets said second averaged spatial orientation.

6. A method, comprising:
    positioning a microstructure device chip above a surface of a substrate; and
    providing therebetween a filler material that is thermally conductive and comprises graphene flakes, wherein providing comprises:
    providing a first layer; and
    providing a second layer adjacent the first layer;
    wherein the first and second layer each comprise graphene flakes.

7. The method of claim 6, wherein providing the first layer comprises:
    depositing a layer of said filler material in a deformable state;
    exposing said filler material in said deformable state to a first spatially oriented force field so as orient the graphene flakes in a first averaged spatial orientation corresponding to said first force field; and
    curing the layer.

8. The method of claim 7, wherein providing the second layer comprises:
depositing a layer of said filler material in a deformable state;
exposing said filler material in said deformable state to a second spatially oriented force field so as orient the graphene flakes in a second averaged spatial orientation corresponding to said second force field; and
curing the layer.

9. The method of claim 8, wherein the first and second averaged spatial orientations are perpendicular.

10. The method of claim 8, wherein the first and second averaged spatial orientations are parallel.

11. The method of claim 10, further comprising exposing a portion of said filler material in said deformable state for either the first layer or second layer to a third spatially oriented force field so as orient the graphene flakes in said portion in a third averaged spatial orientation corresponding to said third force field and different from the first and second averaged spatial orientations.

12. A method, comprising:
depositing a layer with a filler material that is thermally conductive and comprises graphene flakes on a substrate wafer;
mounting a plurality of semiconductor device chips to the substrate wafer with the deposited layer positioned between each semiconductor device chip and the substrate wafer; and
dicing the substrate wafer to produce a plurality of die structures, with each die structure including at least one semiconductor device chip attached to a diced portion of the substrate wafer by said deposited layer of filler material.

13. The method of claim 12, wherein depositing comprises depositing said layer of filler material in a deformable state and exposing said filler material in said deformable state to a first spatially oriented force field to orient the graphene flakes with a first averaged spatial orientation corresponding to said first force field.

14. The method of claim 12, wherein depositing comprises:
depositing said layer of filler material in a deformable state;
exposing first portions of said filler material in said deformable state to a first spatially oriented force field to orient the graphene flakes in the first portions with a first averaged spatial orientation corresponding to said first force field; and
exposing second portions of said filler material in said deformable state to a second spatially oriented force field to orient the graphene flakes in the second portions with a second averaged spatial orientation corresponding to said second force field;
wherein the first and second averaged spatial orientations are different.

15. The method of claim 14, wherein the first averaged spatial orientation is perpendicular to a mounting surface of said semiconductor device chips and said second averaged spatial orientation is parallel to the mounting surface of said semiconductor device chips.

16. The method of claim 15, wherein mounting the plurality of semiconductor device chips comprises mounting each semiconductor device chip to a corresponding first portion having graphene flakes oriented with the first averaged spatial orientation.

17. The method of claim 12, wherein depositing comprises:
depositing a first layer of filler material that is thermally conductive and comprises first graphene flakes;
exposing said filler material of the first layer in said deformable state to a first spatially oriented force field to orient the graphene flakes in the first layer with a first averaged spatial orientation corresponding to said first force field;
depositing a second layer of filler material that is thermally conductive and comprises second graphene flakes; and
exposing said filler material of the second layer in said deformable state to a second spatially oriented force field to orient the graphene flakes in the second layer with a second averaged spatial orientation corresponding to said second force field;
wherein the first and second averaged spatial orientations are different.

18. The method of claim 17, wherein the second averaged spatial orientation is perpendicular to a mounting surface of said semiconductor device chips and said first averaged spatial orientation is parallel to the mounting surface of said semiconductor device chips.

19. A method, comprising:
depositing, onto a wafer that includes a plurality of semiconductor device integrated circuit chips, a layer with a filler material that is thermally conductive and comprises graphene flakes; and
dicing the wafer to produce a plurality of individual integrated circuit chips, with each individual integrated circuit chip including a diced portion of the wafer covered by a diced portion of the deposited layer of filler material.

20. The method of claim 19, wherein depositing comprises depositing said layer of filler material in a deformable state and exposing said filler material in said deformable state to a first spatially oriented force field to orient the graphene flakes with a first averaged spatial orientation corresponding to said first force field.

21. The method of claim 19, wherein depositing comprises:
depositing said layer of filler material in a deformable state;
exposing first portions of said filler material in said deformable state to a first spatially oriented force field to orient the graphene flakes in the first portions with a first averaged spatial orientation corresponding to said first force field; and
exposing second portions of said filler material in said deformable state to a second spatially oriented force field to orient the graphene flakes in the second portions with a second averaged spatial orientation corresponding to said second force field;
wherein the first and second averaged spatial orientations are different.

22. The method of claim 21, wherein the first averaged spatial orientation is perpendicular to a mounting surface of said semiconductor device chips and said second averaged spatial orientation is parallel to the mounting surface of said semiconductor device chips.

23. The method of claim 22, wherein mounting the plurality of semiconductor device chips comprises mounting each semiconductor device chip to a corresponding first portion having graphene flakes oriented with the first averaged spatial orientation.

24. The method of claim 19, wherein depositing comprises:
- depositing a first layer of filler material that is thermally conductive and comprises first graphene flakes;
- exposing said filler material of the first layer in said deformable state to a first spatially oriented force field to orient the graphene flakes in the first layer with a first averaged spatial orientation corresponding to said first force field;
- depositing a second layer of filler material that is thermally conductive and comprises second graphene flakes; and
- exposing said filler material of the second layer in said deformable state to a second spatially oriented force field to orient the graphene flakes in the second layer with a second averaged spatial orientation corresponding to said second force field;
- wherein the first and second averaged spatial orientations are different.

25. The method of claim 24, wherein the second averaged spatial orientation is perpendicular to a mounting surface of said semiconductor device chips and said first averaged spatial orientation is parallel to the mounting surface of said semiconductor device chips.

* * * * *